US009886987B1

(12) United States Patent  
Brahmadathan et al.

(10) Patent No.: US 9,886,987 B1  
(45) Date of Patent: Feb. 6, 2018

(54) SYSTEM AND METHOD FOR DATA-MASK TRAINING IN NON-PROVISIONED RANDOM ACCESS MEMORY

(71) Applicant: CADENCE DESIGN SYSTEMS, INC., San Jose, CA (US)

(72) Inventors: Sandeep Brahmadathan, Bangalore (IN); Jeffrey Scott Earl, San Jose, CA (US)

(73) Assignee: Cadence Design System, Inc., San Jose, CA (US)

( * ) Notice: Subject to any disclaimer, the term of this patent is extended or adjusted under 35 U.S.C. 154(b) by 172 days.

(21) Appl. No.: 14/585,621

(22) Filed: Dec. 30, 2014

(51) Int. Cl.
*G11C 7/10* (2006.01)
*G06F 1/08* (2006.01)

(52) U.S. Cl.
CPC ............. *G11C 7/1072* (2013.01); *G06F 1/08* (2013.01)

(58) Field of Classification Search
None
See application file for complete search history.

(56) References Cited

U.S. PATENT DOCUMENTS

| 7,558,132 B2* | 7/2009 | Carnevale | G11C 7/1051 365/193 |
|---|---|---|---|
| 9,218,575 B2* | 12/2015 | Mozak | G06N 99/005 |
| 2005/0240744 A1* | 10/2005 | Shaikh | G11C 7/1006 711/167 |
| 2012/0087194 A1* | 4/2012 | Oh | G11C 7/1087 365/189.16 |
| 2014/0293718 A1* | 10/2014 | Prakash | G06F 3/0418 365/193 |
| 2014/0321229 A1* | 10/2014 | Duffner | G11C 7/1009 365/233.13 |

* cited by examiner

*Primary Examiner* — Gary W. Cygiel
(74) *Attorney, Agent, or Firm* — Rosenberg, Klein & Lee

(57) ABSTRACT

A system and method providing timing alignment of a data mask (DM) signal with respect to a data strobe (DQS) signal for memory devices not designed for adjusting such alignment is provided. Alignment between data signals (DQ) and a DQS signal is first achieved during a first write training procedure where a data delay value is optimized for one of the DQS or DQ signals. Subsequently, using the optimum delay value from the first write training procedure, a second write training procedure is initiated. In the second write training procedure, timing alignment between the DM signal and the DQ signals is achieved by determining an optimal delay value of the DM signal relative to the DQS signal.

20 Claims, 13 Drawing Sheets

SYSTEM AND METHOD FOR DATA-MASK TRAINING IN NON-PROVISIONED RANDOM ACCESS MEMORY

BACKGROUND OF THE INVENTION

The subject system and method are generally directed to multi-signal timing alignment to ensure reliable high-speed data transfer in Random Access Memory (RAM). The system and method generally provide measures to achieve expedited central alignment of both data (DQ) signal(s) and data mask (DM) signal(s) with respect to data strobe (DQS) signals. In such manner, high speed data transfers to and from RAM, as well as other memories both volatile and non-volatile, may be performed with a reduced risk of data loss, even at higher speeds. The subject system and method are particularly well suited for providing timing alignment of the DM signal with respect to the DQS signal for memory devices not designed for adjusting such alignment and which now is necessitated by the higher speeds that such devices must be operated reliably.

While various approaches to training random access memory (RAM) to effectively communicate in a reliable manner at high speeds are known in the art, no suitable prior art approach presently exists for conventional RAM designs without built-in measures for such training. As RAM speeds and component density continue to ceaselessly increase and as timing margins and tolerances become smaller, the need for precise training and synchronization between data strobe (DQS), data signals (DQ), and data mask (DM) signals between RAM and their associated memory controllers are only exacerbated.

There is therefore a need for a system and method for reliable high speed data transfer with RAM or other memories. There is a need for training and alignment of data, data mask, and data strobe signals between memory controllers and corresponding memories. More particularly, there is a need for optimized and expedited alignment of timing signals between a multiple-data-rate memory interface such as double data rate (DDR) or quad data rate (QDR) interface memory controllers and their corresponding RAM devices such as synchronous dynamic random access memory (SDRAM) devices, dynamic random access memory (DRAM), double data rate synchronous dynamic random access memory (DDR SDRAM), and the like.

SUMMARY OF THE INVENTION

It is an object of the present invention to provide a system and method for expeditious training of random access memory (RAM) or other memories to establish reliable high-speed data transfer in the memory, such as double data rate synchronous dynamic random access memory (DDR SDRAM) and the like.

It is another object of the present invention to provide a system and method for alignment of data signal(s) (DQ), data mask signals (DM), and data strobe signals (DQS) for use with RAM or other memories that do not inherently support DM training.

These and other objects are attained in the system and method for reliable high speed data transfer in RAM.

A method for data mask (DM) signal and data (DQ) signal timing alignment adjustment in transmission to a memory device is provided. The method includes performing write training of at least one DQ signal line using a known data pattern while maintaining a value of the DM signal at a constant value representing an unmasked condition to establish an optimal DQ delay value relative to a data strobe (DQS) signal. The method further includes establishing an optimal DM delay value relative to the DQS signal for the DM signal by successively writing the known data pattern using the optimal DQ delay value for transmission of DQ signals to the memory device while alternating changing the value of the DM signal to provide a known sequence of masked and unmasked bytes of the DQ signals and while incrementally varying a DM signal delay value in each successive write operation. The optimal DM delay value is established responsive to comparisons between the known data pattern and a retrieved data pattern from the memory device in correspondence with data masking in accordance with the known DM signal value sequence.

From another aspect, a method for data mask (DM) signal and data (DO) signal timing alignment adjustment in transmission to a memory device is provided. The method includes performing a first write training procedure of at least one DQ signal line using a known data pattern while maintaining a value of the DM signal at a constant value representing an unmasked condition to establish an optimal delay value of one of a data strobe (DQS) signal and DQ signals. Further, the method includes performing a second write training procedure to establish an optimal DM delay value relative to the DQS signal for the DM signal by successively writing the known data pattern using the optimal delay value of the one of a DQS signal and DQ signals established in the first write training procedure for transmission of DQ signals to the memory device while alternating changing the value of the DM signal to provide a known sequence of masked and unmasked bytes of the DQ signals and while incrementally varying a DM signal delay value in each successive write operation. The optimal DM delay value is established responsive to comparisons between the known data pattern and a retrieved data pattern from the memory device in correspondence with data masking in accordance with the known DM signal value sequence.

From yet another aspect, a system for carrying out data mask (DM) training for a memory device that lacks support therefore is provided. The system has a memory controller the includes a control circuit for performing DM training, and a timing generator establishing a data strobe (DQS) signal. The memory controller further includes a first delay circuit coupled to the control circuit and operable to selectively delay data (DQ) signals being transmitted to the memory device at any of a plurality of delay values in a range of available selectable delay values responsive a delay value signal from the control circuit. Further, the memory controller includes a second delay circuit coupled to the control circuit and operable to selectively delay a DM signal being transmitted to the memory device at any of a plurality of delay values in a range of available selectable delay values responsive a delay value signal from the control circuit. The control circuit is configured to perform a first write training procedure of at least one DQ signal line using a known data pattern while maintaining a value of the DM signal at a constant value representing an unmasked condition to establish an optimal delay value of one of the DQS signal and DQ signals. The control circuit is further configured to follow the first write training procedure with performance of a second write training procedure to establish an optimal DM delay value relative to the DQS signal for the DM signal by successively writing the known data pattern using the optimal delay value of the one of a DQS signal and DQ signals established in the first write training procedure for transmission of DQ signals to the memory device while alternating changing the value of the DM signal to provide a known sequence of masked and unmasked bytes of the DQ signals and while incrementally varying a DM signal delay value in each successive write operation. The control circuit performs comparisons between the known data pattern and a retrieved data pattern from the memory device in correspondence with data masking in accordance with the known DM signal value sequence to establish the optimal DM delay value.

Additional aspects, details, and advantages of the disclosed system and method will be set forth, in part, in the description and figures which follow.

DESCRIPTION OF THE PREFERRED EMBODIMENTS

Figure 1:
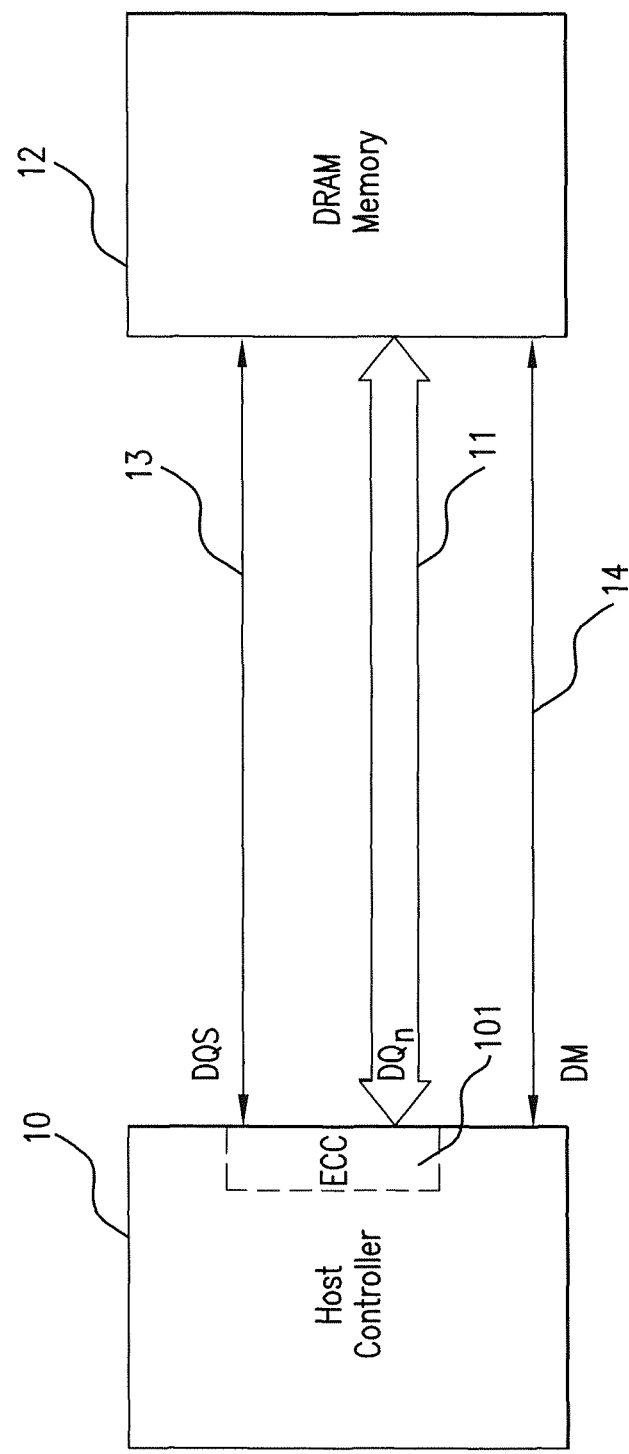
FIG. 1 is a block diagram of an exemplary dynamic random access memory (DRAM) system.

Presently, no suitable systems or methods for alignment of intra-clock cycle timing parameters exists for conventional random access memory (RAM) which does not incorporate proprietary measures particular to the specific hardware configuration. In other words, no suitable measures presently exist for such alignment of data (DQ) and data mask (DM) signals relative to data strobe (DQS) signals for conventional RAM such as DRAM, SDRAM, DDR SDRAM, or the like. Thus, system designers must very carefully ensure that timing skew between and amongst DQ, DM, and DQS lines are precisely accounted for, or use special memory which incorporates proprietary measures for timing alignment such as a dedicated training portion and the like.

To accommodate the requisite operational timing precision, a number of additional constraints must be considered when placing and routing a circuit design. Different etch-lengths, parasitics, and other issues limit designers' options in establishing a circuit design. Moreover, in the prior art, once a design is finalized and a fabricated device results, the design is unable to suitably adapt to changing skew between the DQ, DM, and DQS lines throughout different process, voltage, and temperature (PVT) operational conditions. As clock rates exponentially increase, the timing tolerances and margins shrink which only further exacerbates the problem.

Thus, a system and method for adaptively adjusting the timing skew between signals on the DQ, DM, and DQS lines during a periodic (or simulated) training is provided. The system and method serve to expeditiously determine an optimal (or suitable) delay value (or range) to selectively delay at least one of the DQ, DM, and DQS signals. A suitable delay value is one that gives ample timing margin and tolerance to ensure reliable data capture—even at steadily increasing clock-rates expected in the future while accounting for various asymmetric routing and placement configurations. An optimal delay value is one where the timing margins and tolerances are substantially maximized.

The dearth of suitable timing training measures is only further exacerbated when considering that the data mask results in what appears to be random data written to the memory. Training a memory becomes exponentially more difficult without being able to reliably employ a known data pattern for evaluative comparison. A randomly pulsing data mask (DM) bit does precisely that and subverts the known-good data pattern—nullifying comparisons. The DM bit usually accompanies eight bits of data and (for simplicity) may be considered to be randomly pulsed. The resulting problem is then two-fold. Firstly, the DM bit results in a randomized data which departs from the known data pattern. Secondly, the data mask may be modeled (for simplicity) to have a masking effect half of the time. When the data mask is actuated, the corresponding byte of data is not written to the memory device (and thus may not be retrieved therefrom for subsequent comparison). Thus, were one to attempt to implement a prior art method of training a DRAM device, the known data pattern would be convoluted inasmuch as a randomized DM bit is present in every byte and a portion of the bytes are masked or blanked out. Thus, prior art training measures would fail.

For convenience, in this description, the same numbers may be used to refer to both a data line and the signal carried on said data line. Which of the data or signal is meant will be made clear from the context of the description.

Referring to FIG. 1, there is shown a host controller 10 for effecting storage and retrieval operations in cooperation with a DRAM 12. As will be described in following paragraphs, the host controller 10 employs a number of different interconnections with DRAM 12, such as a number of data ($DQ_n$) lines forming data bus 11, a data mask (DM) line 14, and at least one data strobe (DQS) line 13. The number of data lines of bus 11, data strobe lines 13, and data mask lines 14 may vary for the application. Additional lines and buses such as an address bus, lines to specify data transmission speed, operational mode, and other functions are not shown, but would be known to one of skill in the art.

The one or more DQ lines of bus 11 are provided to transmit data signals from the host memory controller 10 to the DRAM 12, or vice-versa from the DRAM 12 to the host controller 10. One or more DM lines, or DM bus, 14 are provided to selectively mask appropriate bytes (or "words") of data within burst transmissions to the DRAM 12.

Host controller 10 employs the data strobe line 13 to synchronize transfer of data along the data lines 11. In a reading operation, the data strobe signal on line 13, output from DRAM 12, signals the host controller 10 that data is available on one or more of the data lines 11. During a writing operation, the data strobe signal on line 13, output from the controller 10, signals to the DRAM 12 that data is available for capture on one or more of the data lines 11 for storage in the DRAM 12.

The data mask signal on line 14 is provided primarily due to a characteristic restriction of DRAM. Namely, DRAM generally operates in a page write mode where a plurality of bytes are written to the DRAM in a unitary burst. Where a user wishes to write a subset of the page or burst, the data packet for writing may be padded with zero values or inconsequential values and a data mask is set for each of the bytes in the burst which are not intended to actually be written to the DRAM 12. Thus, if for example, DRAM 12 is capable of writing, at minimum, a 4 byte burst, and a user only wishes to write only one byte to the DRAM device, then the user will selectively actuate the data mask bit on each of three of the non-needed bytes to be transmitted to the DRAM device 12, thus marking these bytes as "masked." The DRAM device 12 then evaluates the data mask (DM) bit values for each of the bytes and, responsive to a positive or TRUE value, ignores and does not write the data contained in the masked byte, in this case three marked bytes. In such manner, a user is able to write a smaller portion of the technically available smallest atomic data write to the DRAM 12.

An Error Correcting Codec (ECC) may optionally be employed with the memory according to application and configuration requirements. The ECC may then act to correct errors to the data—provided that it is within a threshold of correction corresponding to the pre-established robustness of the ECC. Accordingly, host controller 10 may optionally include ECC logic 101 for encoding data written to the non-volatile memory 12 and correcting bit errors of data read therefrom.

Figure 2:
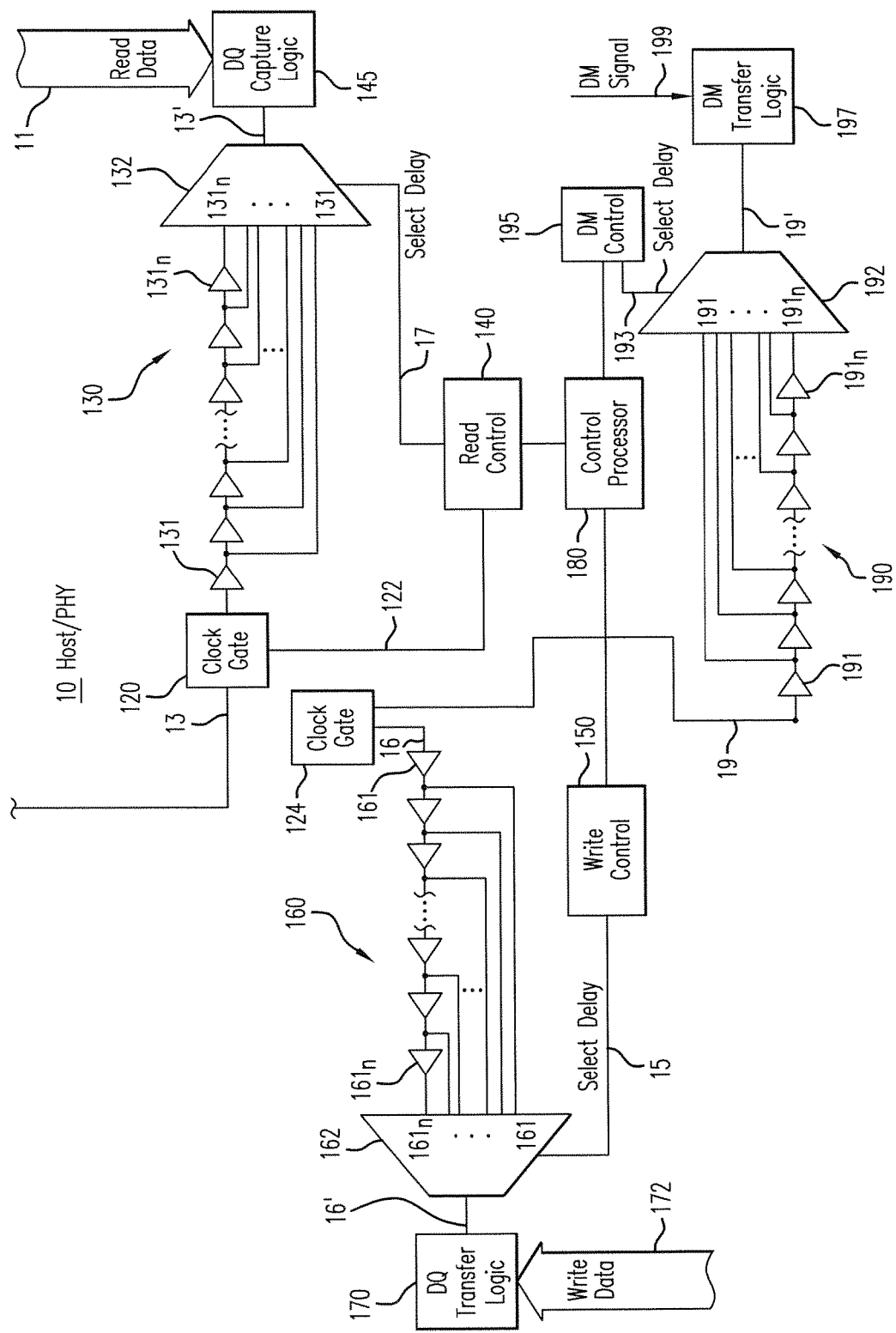
FIG. 2 is a block diagram of a high speed DRAM and memory controller with an exemplary delay circuits.

As seen in FIG. 2, the host controller 10 (also called a memory controller, or physical access (PHY); the terms will be used interchangeably herein) contains a control processor 180 that controls the training process of the PHY 10, as well as the read and write functions of the PHY 10. The PHY 10 includes a selective write delay circuit 160 which may employ a plurality of buffers, gates or other logic devices 161 . . . 161$n$ as a delay line to delay the data signals (DQ) signals to the DRAM 12. The write delay circuit 160 includes a write tap selection circuit 162, which may, for example, be implemented by a multiplexer, or other suitable circuit, to selectively tap a delay line or a plurality of serially arranged logic devices 161-161$n$. Accordingly, a DQ clock signal on clock line 16 from the clock 124 is input to the selective write delay circuit 160. In such manner, the clock signal may be selectively delayed relative to the other signals. A write delay selector line 15 operably couples a write control circuit 150 to the write tap selection circuit 162 to select the amount of delay by choosing an input to the multiplexer 162 from inputs 161 . . . 161$n$, under control of control processor 180 coupled thereto. In such manner, according to the selection signal output on the write delay selector line 15, the tap selection circuit 162 passes the DQ clock signal 16 at a selected delay to be output from the delay circuit 160 as delayed DQ clock signal 16' to the transfer logic 170 for transmission of the write data on the internal bus 172 to the DRAM 12, via the data bus 11 (not shown in this diagram for simplicity).

The host controller 10 also contains a selective read delay circuit 130 which may employ a plurality of buffers, gates or other logic devices 131 . . . 131$n$ as a delay line to delay the data strobe signal (DQS) from the DRAM 12. The delay circuit 130 includes a read tap selection circuit 132, which may, for example, be implemented by a multiplexer, or other suitable circuit, to selectively tap the delay line formed by the plurality of serially arranged logic devices 131-131$n$. In such manner, a DQS data strobe input on line 13 is gated into the selective read delay circuit 130 by clock gate 120 responsive to an enable signal output on line 122 by the read control circuit 140 that is coupled to the control processor 180 and controlled thereby. Responsive to a delay select signal output from the read control circuit 140 on line 17, the read tap selection circuit 132 outputs a DQS signal on line 13', delayed by the selected value, to the DQ capture logic circuit 145, for transferring the read data from DRAM 12 on data bus 11 to an internal bus (not shown in this diagram for simplicity).

PHY 10 further includes a selective data mask (DM) delay circuit 190 which may employ a plurality of buffers, gates or other logic devices 191 . . . 191$n$ as a delay line to delay the data signals DM signal to the DRAM 12. The DM delay circuit 190 includes a DM tap selection circuit 192, which may, for example, be implemented by a multiplexer, or other suitable circuit, to selectively tap a delay line or a plurality of serially arranged logic devices 191-191$n$. Accordingly, a DM clock signal on clock line 19 from the clock 124 is input to the selective DM delay circuit 190. In such manner, the clock signal may be selectively delayed relative to the other signals. A DM delay selector line 193 operably couples a DM control circuit 195 to the DM tap selection circuit 192 to select the amount of delay by choosing an input to the multiplexer 192 from inputs 191 . . . 191$n$, under control of control processor 180 coupled thereto. In such manner, according to the selection signal output on the DM delay selector line 193, the DM tap selection circuit 192 passes the DM clock signal 19 at a selected delay to be output from the delay circuit 190 as delayed DM clock signal 19' to the DM transfer logic 197 for transmission of the DM signal on line 199 to the DRAM 12, via the line 14 (not shown in this diagram for simplicity). By this arrangement, the memory controller 10 can selectively delay the data strobe signal on line 13, one or more of the data signals on bus 11, and the data mask signal on line 14.

Figure 4A:
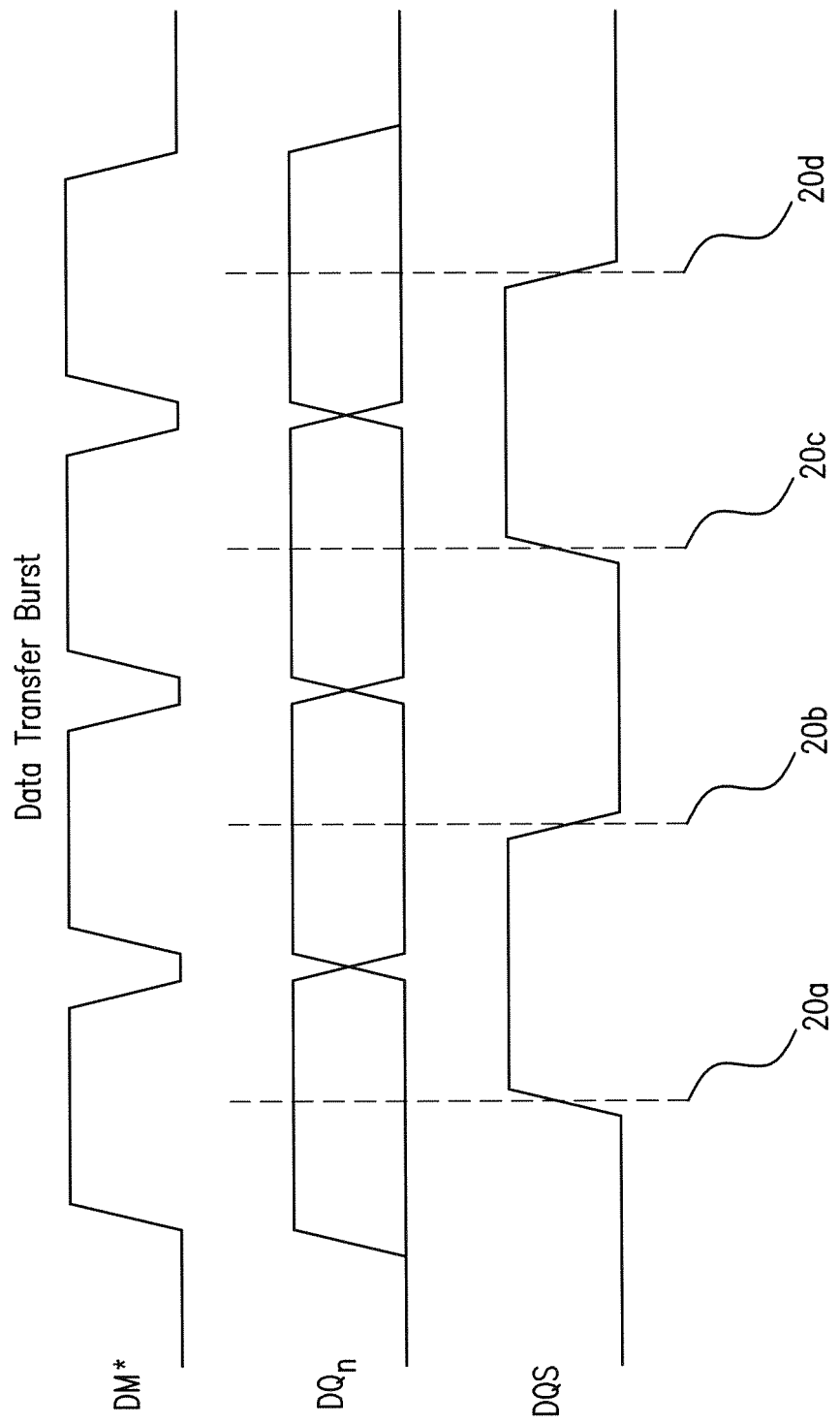
FIG. 4A is a timing diagram illustrating an example of central-alignment between a source synchronous transmitted data strobe (DQS) signal, data transmission (DQ) signals, and the data mask (DM) signal.

FIG. 4A shows an optimized central-alignment of the data strobe signal DQS to an exemplary data transmission signal DQ$_n$ and data mask signal DM. The data strobe rising edges 20$a$, 20$c$ and falling edges 20$b$, 20$d$ are centrally aligned with respect to the data signal and the data mask appearing above. In such manner, operational timing tolerances and margins are maximized such as skews, aberrations, and other timing issues are necessarily minimized. Thereby, the memory controller 10 and DRAM 12 are able to effectively and reliably communicate even at high transmission speeds.

As seen in FIG. 4A, multiple data rates, such as (DDR) or quad data rate (QDR) may be employed where multiple data beats are signaled for each clock signal. In the example seen in FIG. 4A, a double data rate (DDR) where the data transmission is keyed at a double beat occurring at both the rising and falling edge of the data strobe is performed.

Figure 4B:
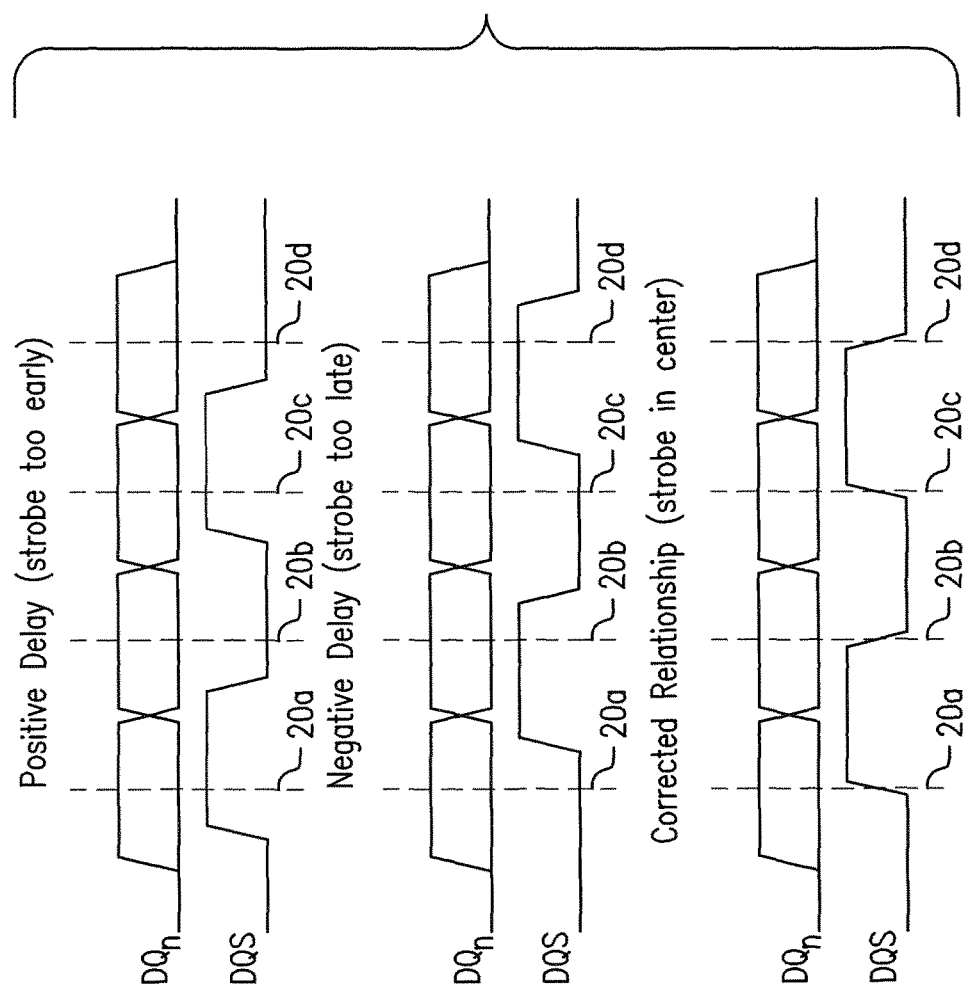
FIG. 4B is a set of exemplary timing diagrams comparatively illustrating examples of skewed time alignments as delay values are swept to adjust a delay between source synchronously transmitted strobe (DQS) and data transmission (DQ)

As seen in FIG. 4B, the sub-optimal alignments of the relative timings of the data signal (DQ) and the data strobe signal (DQS) are seen. A positive delay with a strobe too early, a negative delay with a strobe too late, and the optimal corrected relationship with the centrally aligned strobe, are shown. In situations other than the optimally arranged delay between the data strobe, data mask, and the data signals, the possibility exists that transmitted data may be missed, or only partially captured, by a receiving cache, register, flip-flop, or the like, in either the memory controller or the DRAM. During training, the relative delay between the data strobe, data mask, and data signals will be swept through the range of available selectable delay values provided by the delay circuit (as described above).

Figure 5:
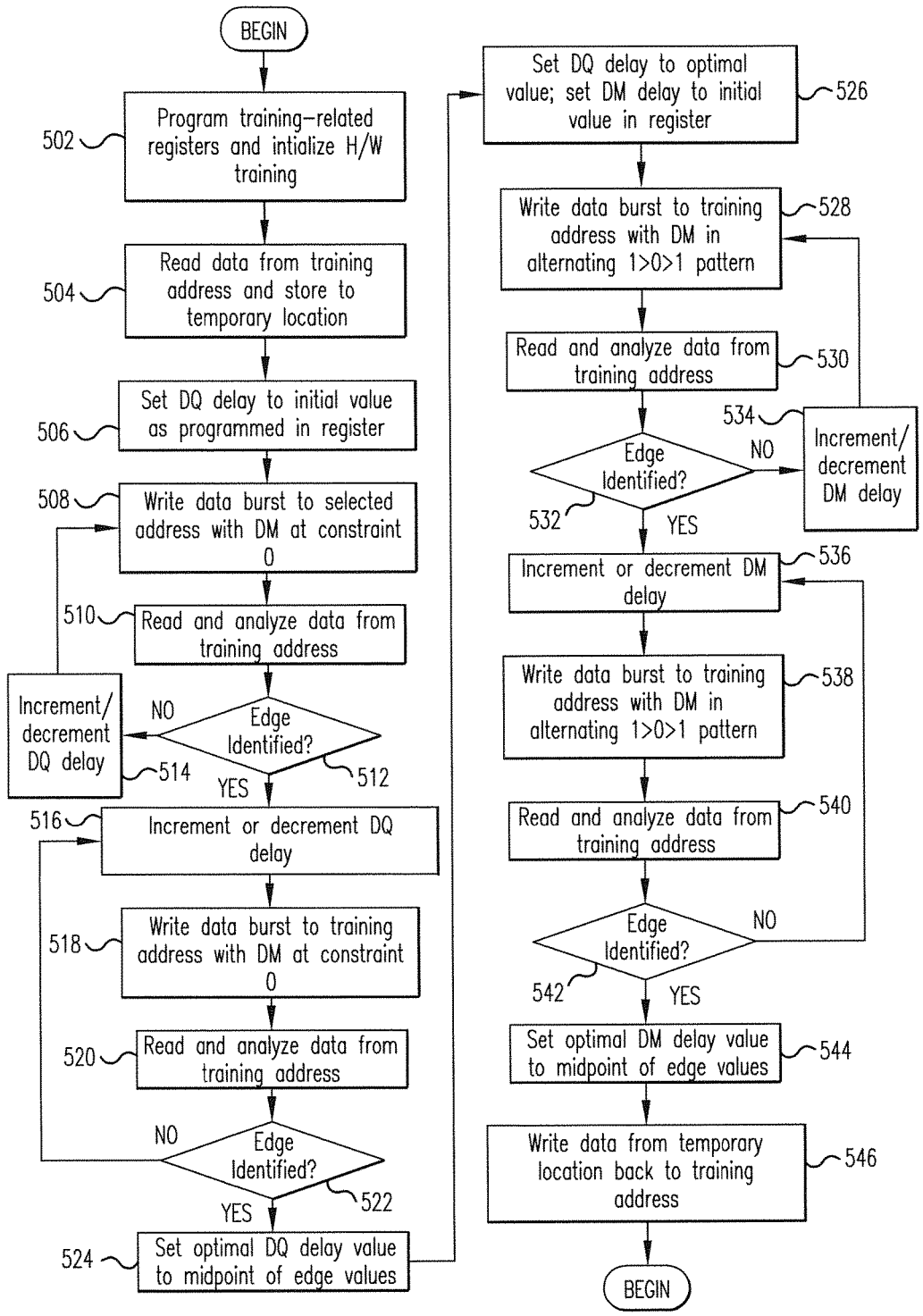
FIG. 5 is an exemplary flow diagram illustrating a flow of processes in the disclosed system and method for aligning data transmission (DQ), data mask (DM), and data strobes (DOS) for a DRAM memory.

As seen in FIG. 5, an exemplary flow of processes for establishing an optimal or otherwise suitable delay value in DRAM write training is illustrated. The method provides DM signal and DQ signal timing alignment adjustment in transmission to a memory device. Thus, the timing of the DM signal is calibrated with respect to the DQS signal, as are the DQ signals to thereby provide the best possible correspondence between the DM signal and any DQ signals to be masked thereby. At block 502, an address is assigned to establish a training portion of the DRAM. Depending upon the DRAM type used, a number of different addressing schemes may be employed. The software, which likely executes on a main processor coupled via a bus to the memory controller, may, in concert with an operating system or other suitable memory mapping and management measures, choose a starting address for the training of the DRAM device. The software executing on the processor (or other such suitable measures) communicates the starting address into a register, cache, or other input measures for the memory controller. Alternatively, the memory controller may selectively establish a portion of the memory itself for training.

Flow then proceeds to block 504 where the data pre-existing at the address selected for training is read from the DRAM. The pre-existing data is copied and stored in a temporary buffer such as a cache, SRAM, register, or within the software running on the attached computer device. The pre-existing data should preferably also be verified to be correct through suitable measures as would be known to one of skill in the art. In configurations where the training portion is established in a non-used portion of DRAM, this operation may be omitted.

Flow proceeds to block 506, where the DQ delay is established for training. An initial DQ delay value may be established by any one of a number of measures. A range of available delay values may be determined by evaluating the delay circuit 132 (as seen in FIG. 2) to determine a number of discrete delay values available according to its specific configuration. Alternatively, the memory controller may be pre-established with an indication of the number and values of available delay values for the delay circuit 132. In a simulation environment, the delay may be determined by querying the design database for delay circuits established in any one of the data (DQ), data strobe (DQS), or data mask (DM) lines. Additionally, heuristics, or other such knowledge of the probability or statistics of likely or preferred delay values may be employed. Generally, the DQ delay value is initialized to be an extreme value at one end of the number of delay values, such as 0 or 127, in an exemplary delay circuit as seen in FIG. 2, which may have, for example, 128 different delay values. In other configurations, other delay ranges such as 256, 512, 1024, 2048, or other such appropriate numbers of delay values may be provided. According to a heuristic analysis, a probability range of delay values may be determined to be a subset of the available range and the initial DQ delay may be accordingly set to be proximate to delay values yielding leading or trailing edge signal alignment. Although the use of DQ delay values to delay the DQ signals relative to the DQS signal are specifically described herein, there are applications where the first write training procedure of blocks 502-524 for the disclosed system may be carried out by delaying the DQS signal relative to the DQ signals, using a range of DQS delay values and establishing an optimal DQS delay value by the method described for determining an optimal DQS delay value.

Once an initial DQ delay value has been established, flow proceeds to block 508 to write a burst of data to the training address, with the data mask value set to 0 for each of the segments of the data burst. Because the data mask value will be maintained at a constant 0, the burst of data will be written to the memory without interference from the data mask. That is, none of the burst of data will be masked, and thus subsequent comparisons should result in identity between the data portion written and subsequently retrieved and compared.

The burst of data is written with a known data pattern. The known data pattern may be anything such as a burst of 1s, 0s, an alternating 1 and 0 pattern, the output of a pseudo-random pattern generator (PRPG), or the like. Once the known data pattern is established or provided from software, it is saved within the microcontroller for subsequent comparisons with the written data.

The data pattern written in block 508 is then read from the DRAM device and analyzed at block 510 to affect a comparison between the written data and the provided known data pattern. Flow proceeds to block 512 where it is determined whether the delay value where there has been a first edge alignment (leading or trailing edge alignment) between the DQ and DQS signals has been identified. Which end of the available range of delay values was used as the initial delay value will determine what edge alignment (leading or trailing) is first detected. By using an initial delay at an extreme end of the available delay range and appropriately incrementing or decrementing the delay value, the first edge alignment will be detected at the delay value that achieves capture of valid data where the preceding delay value yielded invalid data capture. Thus there is a change from capture of "bad" data to "good" data. If the data comparison is valid and results in an identity between the retrieved pattern from the DRAM and the known data pattern, then the beginning or end of a suitable range of delay values has been identified. If the comparison results in a lack of identity between the written data pattern and the provided known data pattern, then the DQ delay value is either incremented or decremented at block 514, according to whether the initial DQ delay value was respectively determined to be the beginning or the end of the range of suitable delay values. Flow then returns to block 508.

In such manner, a cyclic execution of a loop between blocks 508, 510, 512, and 514 is repetitively executed until a comparison between the written data pattern and the provided known data pattern results in substantial identity (accounting for various error correcting code (ECC), cyclic redundancy check (CRC), and other such measures which may be employed, depending upon the application or configuration).

Once the delay value for the first edge (leading or trailing) alignment has been determined at decision block 512, flow proceeds to block 516 to continue incrementing or decrementing the DQ delay value by a program delay step to proceed into the range of available delay values. A burst of data is then written to the training address with the DM maintained at 0 at block 518. Flow then proceeds to block 520 to read and analyze the written data from the DRAM.

Flow then proceeds to block 522 where it is determined whether the second edge alignment (trailing or leading), alignment between the edge of the DQ signal relative to the DQS signal opposite to the edge alignment identified at block 512 of the range of suitable DQ delay values has been identified. If the comparison is invalid, and thus there is not an identity between the retrieved pattern from the DRAM and the known data pattern, then such defines an opposing end of a range of suitable delay values has been identified. If the comparison is valid, where there continues to result in an identity between the written data pattern and the provided known data pattern, then the flow returns to block 516 to once again increment or decrement the DQ delay value.

Thus, a cyclic loop continues to execute between block 516, 518, 520, and 522 until such comparison fails between the retrieved data pattern from the DRAM and the known data pattern. At such point, the suitable range of delay values has ceased and the retrieved data from the DRAM may be seen to be corrupted due to an invalid DQ delay setting. Thus, at detection of alignment of the second edge there is a change from capture of "good" data to "bad" data.

At this point, flow breaks from the loop at decision block 522 and proceeds to block 524 where an intermediate value between the leading and trailing DQ delay values is determined to be the optimal DQ delay value. Such optimal DQ delay value may be determined in any manner, as would be known to one of skill in the art, such as by summing both the leading and trailing DQ delay values and dividing by 2 to establish an average or mean value. Any other suitable measures for determining an optimal delay value may be employed. While, in a preferred configuration, the optimal delay value is employed, other of the delay values within the range of delay values yielding valid data may be considered a suitable delay value and may be employed for a particular operating speed.

Flow then proceeds to block 526 where the DQ delay value relative to the DQS signal is set as the optimal delay value, and the delay value of a DM bit is suitably established at an extreme beginning or ending value of the available range of delay values (in same manner as was discussed above). At block 528, a burst of data is written to the training address of the DRAM with an alternating 1→0→1 DM pattern. In such manner, the DM signal will be an alternating pattern of regular on-off pulses, with corresponding portions of the DQ signal being masked from writing. Thus, the alternating change of the value of the DM signal provides a known sequence of masked and unmasked bytes of the DQ signals, which in itself is a known pattern. Thereby, the known data pattern (suitably accounting for the alternating unmasked and masked portions) may then subsequently be evaluated after the writing thereof.

Flow proceeds to block 530 to read and analyze the written data from the DRAM device, and then to block 532, where it is determined whether the first edge alignment (leading or trailing) between the DM signal and the DQS signal has been identified, in the same manner as the leading or trailing edge alignment was identified in block 512. Which end of the available range of delay values was used as the initial delay value will determine what edge alignment (leading or trailing) is first detected. By using an initial delay at an extreme end of the available delay range and appropriately incrementing or decrementing the delay value, the first edge alignment will be detected at the delay value that achieves capture of valid data where the preceding delay value yielded invalid data capture. Thus there is a change from capture of "bad" data to "good" data.

If the first edge alignment is not identified, due to lack of identity between the written data pattern retrieved and the provided known data pattern (accounting for the alternating unmasked and masked portions), then the DM delay value is either incremented or decremented at block 534, according to whether the initial DQ delay value was respectively determined to be the beginning or the end of the range of suitable delay values. Flow then returns to block 528.

In such manner, a cyclic looping pattern is then established between blocks 528, 530, 532, and 534, until a comparison between the written data pattern retrieved from the DRAM device and the provided known (partially masked) data pattern results in identity therebetween. Once a data pattern read from the DRAM device is found to have identity with the known data pattern (suitably accounting for the alternating DM bit and the alternating mask of data portions), a DM delay value corresponding to a leading or trailing edge alignment is identified and flow proceeds to block 536.

At block 536, another cyclic loop is established between blocks 536, 538, 540, and 542 with iterative writes to the DRAM with the alternating 1→0→1 DM pattern for comparison, until such comparison between the written data pattern and the known data pattern fails. Namely, the DM delay value is incremented or decremented, as appropriate, at block 536, the burst of data is written with the alternating DM signal applied at block 538, the written data is read from the DRAM and analyzed at block 540, and it is determined whether the second edge alignment, the edge alignment opposite to the edge alignment identified at block 532 has been identified. If the comparison continues to result in an identity between the written data pattern retrieved and the provided known (partially masked) data pattern, then the flow returns to block 536 to once again increment or decrement the DM delay value.

Upon failure of the comparison at block 540, the cyclic loop is broken and flow proceeds to block 544, as the second edge alignment (leading or trailing edge) between the DM and DQS signals has been determined. Thus, at detection of alignment of the second edge there is a change from capture of "good" data to "bad" data. During comparisons, if errors are below a certain threshold (within a correctable range for ECC efficacy), then ECC correction may be engaged to correct minor bit flip errors encountered in a DRAM. An optimal DM delay value is determined from the range of DM delay values between those establishing leading and trailing edge alignment as in intermediate value, at block 544, preferably the mean, midpoint or average of that range of delay values is determined.

Once the optimal DQ and DM delay values are established, the DRAM data which was stored in a temporary buffer at block 504 is written back into the training address to resume normal functioning at block 546. In configurations where the training portion is established in a non-used portion of DRAM, this operation may be omitted.

Additionally, in some configurations, to ensure proper timing alignment has indeed been achieved, a relatively large portion of data is written to the DRAM with the established DQ and DM delay values. After completing the extended writing operation, the data is then retrieved from the DRAM device for comparison to ensure the errors are within the expected range established according to the optimal DQ and DM delay values.

Throughout this disclosure, the leading and trailing edges and corresponding incrementing and decrementing may be suitably switched. In other words, the range of available delay values may be swept in either direction, starting from the high and decrementing to low, or starting at a low delay value and incrementing to a high delay value. In certain configurations where establishing a optimal delay value immediately is required, yet further approaches may be employed to define a suitable delay value, such as by starting with a best-approximation at a midpoint delay value estimated to be within the range of suitable delay values. If such value from an above-described comparison is found to be unsuitable, another mid-point delay value may be selected. In other configurations where, for example, the range of available delay values is large and no expected range may be determined, other known searching measures may be employed.

The DQ delay training and DM delay training may beneficially be performed once for each DQ line and DM line to data strobe combination for each different chip or interface of DRAM. A delay value table may be employed in cache or other memory available to the memory controller or host computer to selectively assign different delay values for different interfaces, chips, or portions of the DRAM to achieve optimized delay values.

In certain configurations, the contours or range of an acceptable delay value are determined by sweeping through the incremented delay value as-written. In other words, each segment of data written to the DRAM is compared with the provided known data pattern to determine substantial identity therewith. During the comparison, it is expected that a sequential range of data segments will not substantially correlate with the provided known data patterns, thereby indicating misalignment and unsuitable delay values. As the unsuitable range is traversed, data errors will cease and a valid comparison of the written data pattern and the provided known data pattern will agree. It is expected that the agreement of the provided known data pattern and the written data pattern will have another range of suitable delay values which will end after a number of delay increments. Following a suitable delay range, yet another range of unsuitable delay values resulting in a lack of substantial identity (accounting for ECC and data masking) between the provided known data pattern and the written known data pattern will result. By determining the range of suitable delay values, delay values yielding leading edge and trailing edge alignment between signals (DQS and DQ, DM and DQ), an intermediate value or average of that range can then be used as an optimal delay value. By employing the optimized delay value (in the middle of the range of suitable delay values), the greatest tolerance to either late or early data signals may be accommodated to accordingly avoid both set-up and hold violations.

In such manner, both the fabricated device and/or circuit design thereof under test (in certain contemplated simulations) may operate with less constraints and at substantially higher data rates and frequencies, all retaining reliable data rate capture. For example, circuit designers of the device may be given greater latitude to diverge from identical trace lengths for the data (DQ) lines, the data mask (DM) lines, or the data strobe (DQS) lines. Designers may thereby be able to diverge from a grouped bus (if beneficial to the particular design), with less detrimental impact and resulting skew. By providing freedom to circuit designers to follow workable paths for the data signals, data mask signals, and/or data strobe signals, the design is better able to achieve closure and sign-off through certain simulations and modeling (though certain aberrations may still exist to be remedied during periodic DQ/DM trainings). Preferably, such simulations are performed at various process, voltage, and temperature (PVT) corners to ensure operability at all (or an expected portion) of operational conditions. Additionally, in the fabricated device, certain timing anomalies or aberrations may be more gracefully accommodated through the periodic re-alignment or training of the delay values between data signals, data mask signals, and data strobe signals to account for such change in operational conditions. Such periodic re-alignment may be performed responsive to a set timer, upon initialization of a system, or responsive to detected operational conditions, such as an unexpectedly high level of data transmission errors, detected temperature, or voltage changes, or the like.

Figure 6:
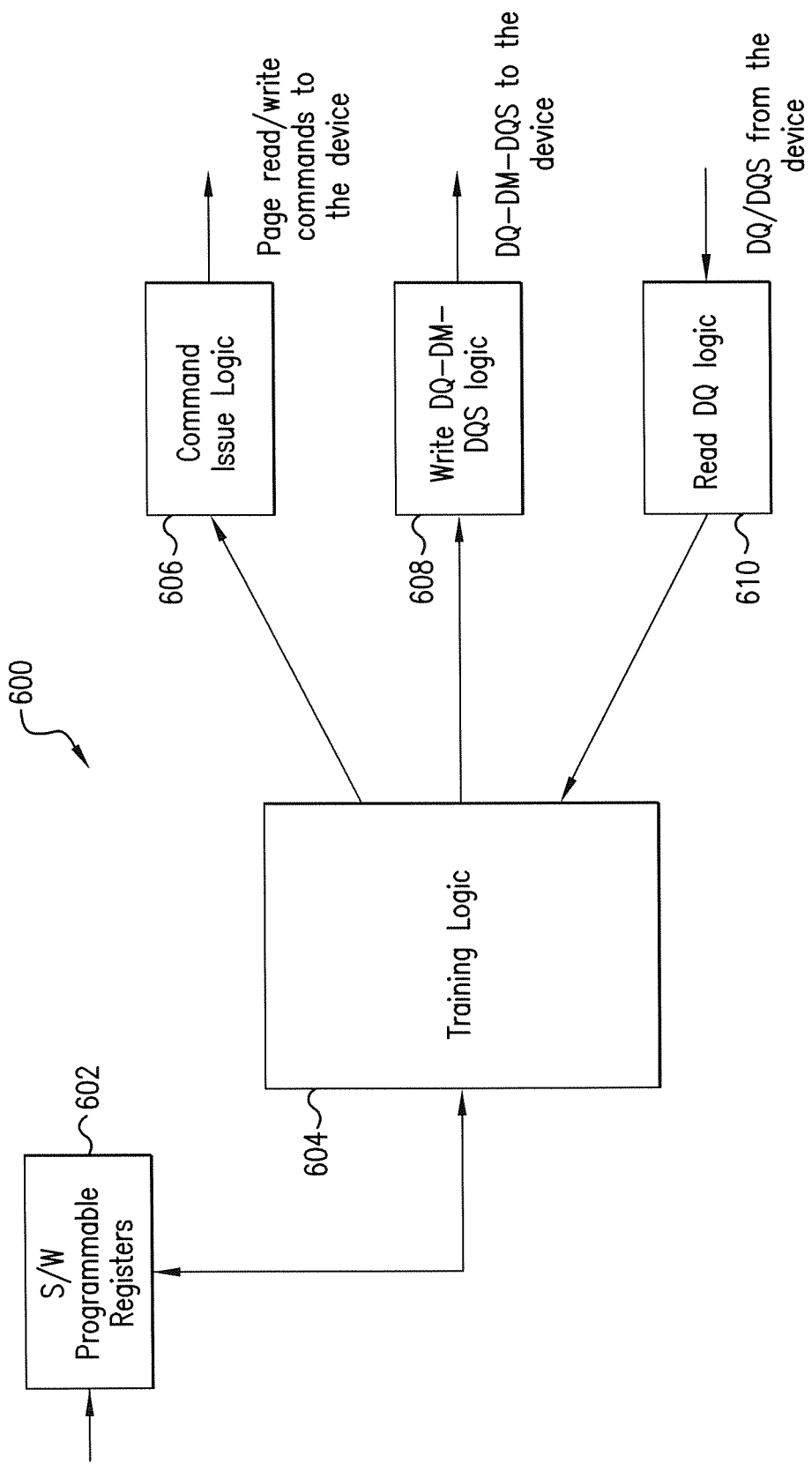
FIG. 6 is a block diagram illustrative of an exemplary training logic.

FIG. 6 provides a block diagram of an exemplary system 600 including a control circuit in the form of training logic 604 employed to train both the data (DQ) delay and the data mask (DM) delay, and thus establish the respective delay values for both DQ and DM signals relative to the data strobe (DQS) signal. A software programmable register 602 may receive a designation of a number of operational parameters from software which may run within a processor, system on-chip (SOC), or the like hosting the memory controller and training logic 604 therein. Such operational parameters for the training may include an indication of the available hardware delay circuits, a range of delay values, an indication of a location within the DRAM for the training portion, a size thereof, an enumeration of different data rate modes available to the memory controller and the DRAM(s), amongst other exemplary operational parameters. Beyond operational parameters, certain other data may be retrievable or acceptable into the software programmable registers 602, such as a pre-established known data pattern, the output of the pseudo-random generator (PRPG), or the like. Software programmable registers 602 are either disposed in the training logic 604 or established in operable communication therewith. Training logic 604 may be located, at least in part, external to the memory controller, or in some cases within an integral portion of the DRAM. Any other suitable locations for the training logic 604 may be employed as well.

Training logic 604 may be composed of a number of gates in an application specific integrated circuit (ASIC), a field programmable gate array (FPGA), programmable logic array (PLA), a control processor, such as control processor 180 and incorporate control circuits 140, 150 and 195, or may be suitably simulated with one or more software modules operating within a processor. Training logic 604 may execute certain sub-modules either disposed therewithin or coupled thereto, such as command issue logic 606, write DQ-DM-DQS logic 608, or read DQ logic 610. The command issue logic 606 may issue various read/write and masking commands to the DRAM along with certain operational parameters, such as data rate selection, addressing, chip select, various operational modes, and the like. Command issue logic 606 may also be suitably implemented in discrete logic gates such as in an ASIC, an FPGA, or suitable software module(s) within a fabricated device, or within a pre-fabrication simulation, such as during sign-off, or placement and routing analysis of a circuit design for eventual fabrication.

The write DQ-DM-DQS logic 608 implements data, data mask, and data strobe signals to the device. Read DQ logic 610 implements data and data strobe signals from the device. Any number of other such suitable logic portions may be employed as would be apparent to one of skill in the art.

Figure 7:
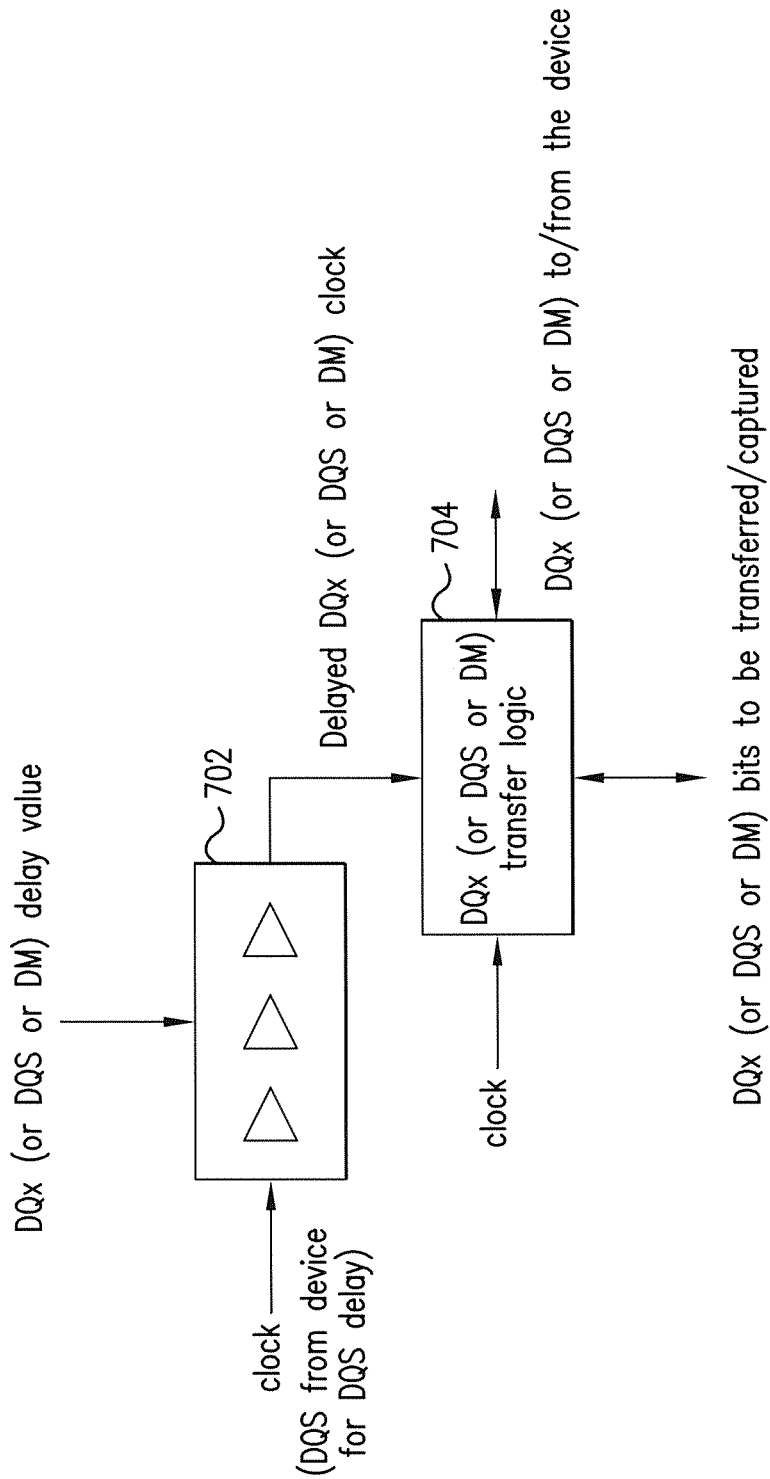
FIG. 7 is a schematic block diagram of an exemplary delay structure applied to a data transmission (DQ), data strobe (DQS), or data mask (DM) lines.

FIG. 7 is an exemplary schematic block diagram of an implementation of a delay circuit. Delay circuit 702 receives a clock signal and a DQ or DM delay value, or a received DQS signal and a DQS delay value, and accordingly delays the clock/DQS signal to output a delayed DQ clock signal, DM clock signal or DQS signal to the DQ, DM or DQS transfer logic 704 for directly interfacing with the DRAM. The DQ, DM or DQS transfer logic 704 receives the delayed DQ or DM clock, or delayed DQS signal, from the delay circuit 702 and accordingly writes, captures the DQ and DM bits to the device according to the DQS strobe. A corresponding delay circuit 702 may applied for each of the DQ data bits, DQS strobe, and DM bits. In such manner, each bit of the DQ, DQS, and DM lines can be individually controlled based on a respective delay value. Alternately, for the DQ bits, all of the DO bits can be controlled responsive to a single delayed DQ clock signal based on a single delay value.

Figure 8:
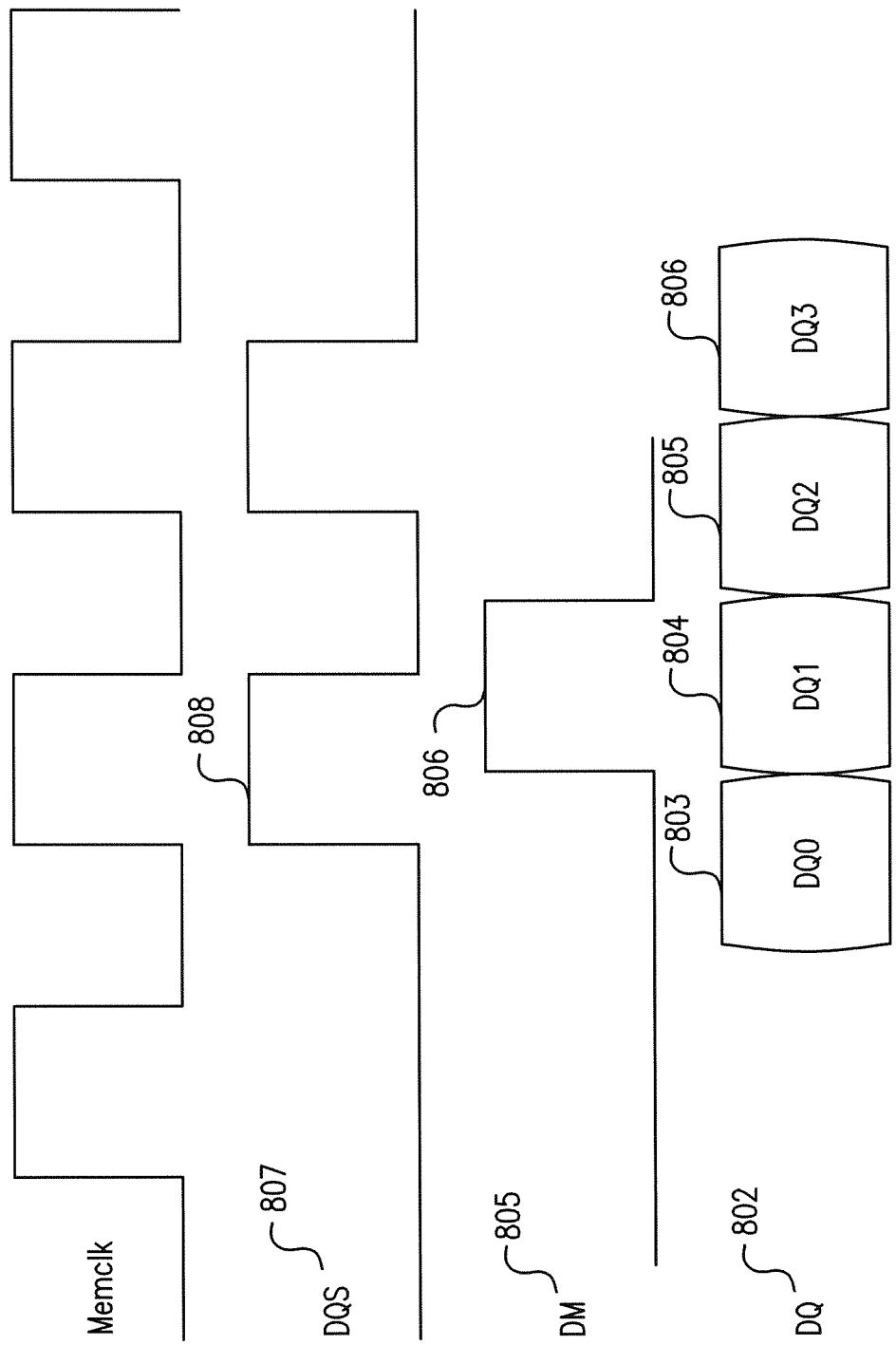
FIG. 8 illustrates an exemplary nominal alignment of memory clock (Memclk), data strobe (DQS), data mask (DM), and data transmission (DQ) bits.

As seen in FIG. 8, a nominal relative arrangement of a memory clock signal, data strobe signal 807, data mask signal 805, and data signal 802 are illustratively shown. The memory clock signal, Memclk, continuously pulses in a cyclic manner. The data strobe 807 periodically pulses, in accordance with the memory clock signal, when a data signal 802 is available on the data lines. One such pulse 808 is shown at a high value. The data mask signal 805 pulses according to an established portion of the data signal 802 which is not intended to be written into the DRAM. One such pulse 806 is shown to correspond with a data "word" DQ1 (804) within the data signal 802. In operation, the first data word DQ0 (803) is written to the DRAM along with the third and fourth data words, DQ2 (805) and DQ3 (806). Inasmuch as the pulse 806 of the data mask signal 805 occurs with the second data word DQ1 804, DQ1 will be transmitted, but will be masked and not written to the DRAM itself. Resultantly, only data words DQ0 803, DQ2 805, and DQ3 806 will be written into the DRAM.

Figure 9A:
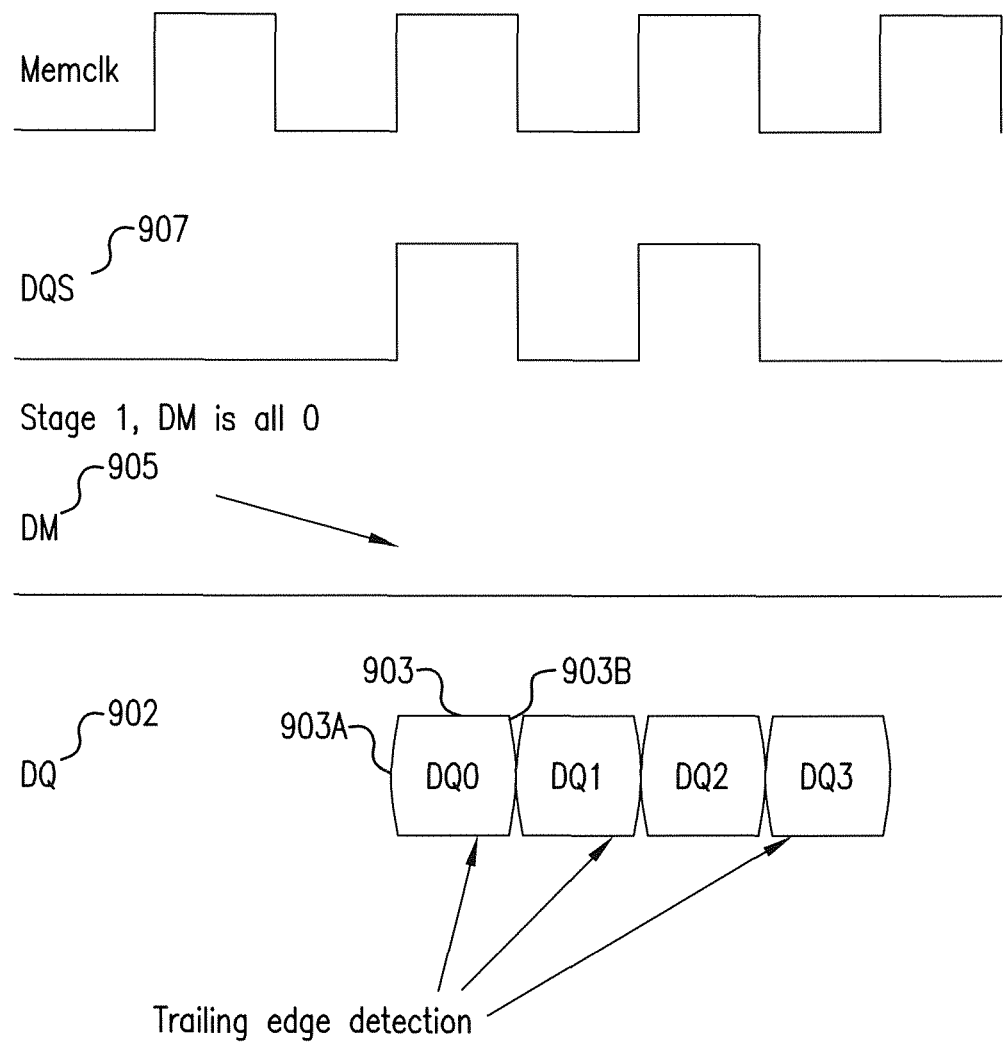
FIG. 9A shows an exemplary chart showing an interrelation of various signals including memory clock (Memclk), data strobe (DQS), data mask (DM), and data transmission (DQ) during an illustrative portion of certain configurations of the subject system and method.

As seen in FIG. 9A, a DM signal 905 is maintained at a zero-value so that none of the data patterns to be written from a DQ signal 902 are masked. In such manner, a known data pattern comprising one or more data words 903 are transmitted to the DRAM and effectively written thereto. As the DM is maintained at a 0 value, none of the words are masked and the transmitted data pattern does not include an additional random data bit for the data mask. As described above in FIG. 5 and the related descriptions, an initial DQ delay value is arrived upon and is continuously swept through a range of available delay values from one extreme end of the range until a retrieved data pattern from the DRAM substantially matches a known provided data pattern used for the writing. Once the data patterns are in substantial agreement, the trailing edge 903A may be said to be found.

Figure 9B:
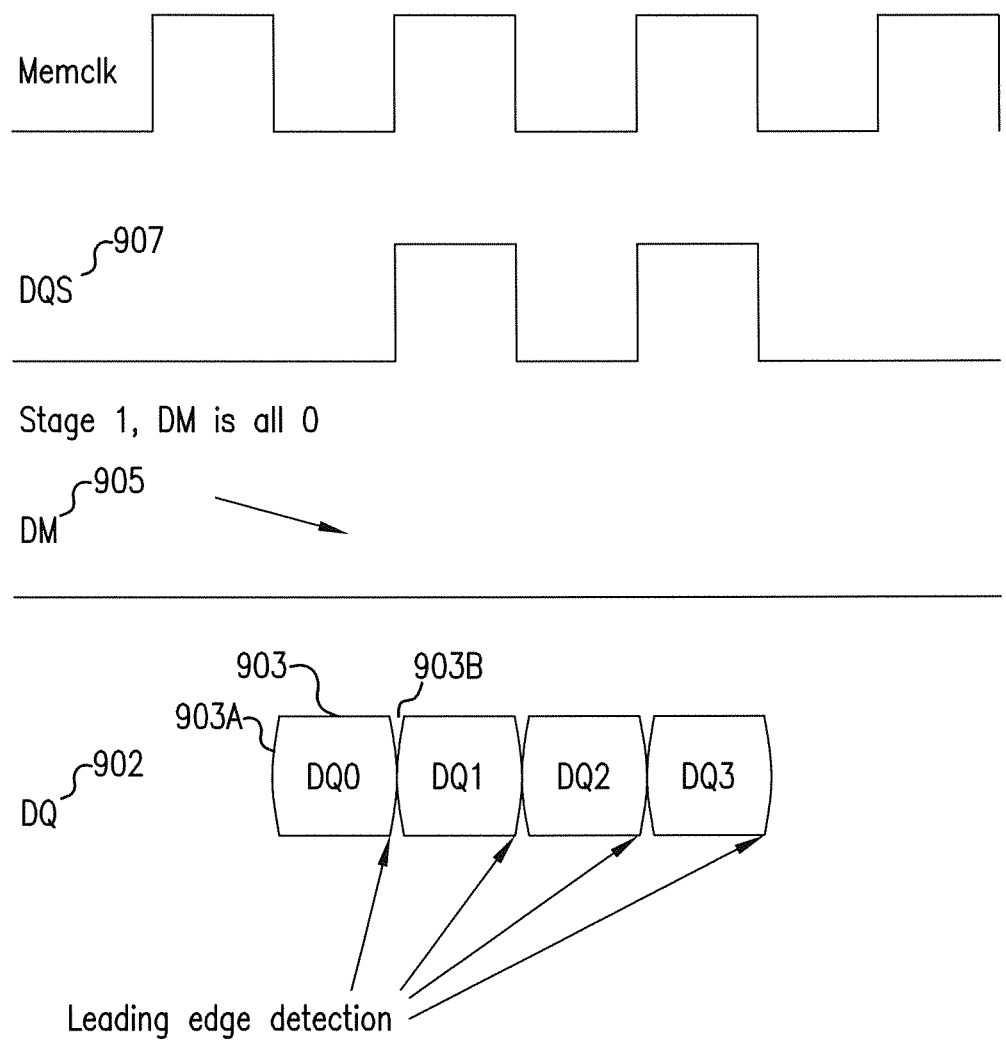
FIG. 9B shows an exemplary chart showing various signals including memory clock (Memclk), data strobe (DQS), data mask (DM), and data transmission (DQ) during an illustrative portion of certain configurations of the subject system and method.

Once the trailing edge has been determined, the sweep continues through the range of available delay values. The sweep through the range of available DQ delay values continues into FIG. 9B to determine the leading edge thereof. The leading edge 903B of the one or more data words 903 is determined upon a failure of the comparison of the written data pattern with a retrieved data pattern from the DRAM device. Throughout the sweep, it is noted that the DM 905 is held to a 0 value.

Through the successive adjustments to the DQ delay value, the delay of the DQ signal 902 to the DQS signal 907 is adjusted to determine both the beginning (or leading) and ending (or trailing) edges of alignment between the DQS and DQ signals, and thereby the range of suitable delay values for the DQ delay value. Within the range of suitable delay values for the DQ delay relative to the DQS signal, one or several optimal delay values may be chosen. Ideally, the optimal delay value is selected from a midpoint between the delay values yielding leading and trailing edge alignment between the DQ and DQS signals, determined for instance by averaging the delay values yielding leading and trailing edge alignment (903A and 903B).

Figure 9C:
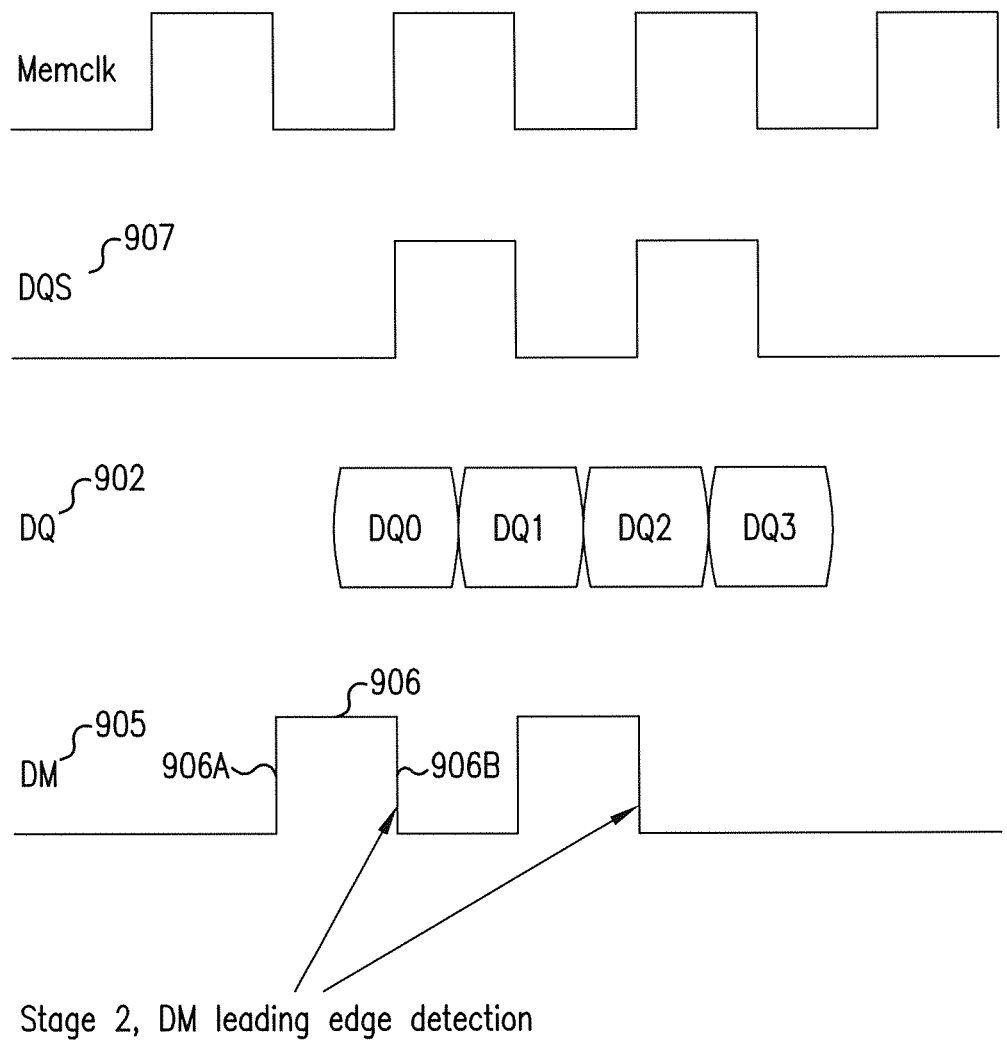
FIG. 9C shows an exemplary chart showing various signals including memory clock (Memclk), data strobe (DQS), data mask (DM), and data transmission (DQ) during an illustrative portion of certain configurations of the subject system and method; and, FIG. 9D shows an exemplary chart showing various signals including memory clock (Memclk), data strobe (DQS), data mask (DM), and data transmission (DQ) during an illustrative portion of certain configurations of the subject system and method.

Once an optimal (or suitable) delay value has been selectively assigned to each of the DQ lines, process proceeds to a training of the data mask (DM) signal 905 relative to the data strobe (DOS) signal 907, as seen in FIG. 9C. The DM signal 905 is set to an alternating and regular pattern of 1-0 pulses. One pulse 906 is seen where the DM signal 905 reaches a logical yes or 1 value. The DM delay value is accordingly swept through the range of available delay values until a leading edge 906B has been detected at the value where the data retrieved from the DRAM and the known data pattern are in substantial agreement, accounting for the data masking.

Figure 9D:
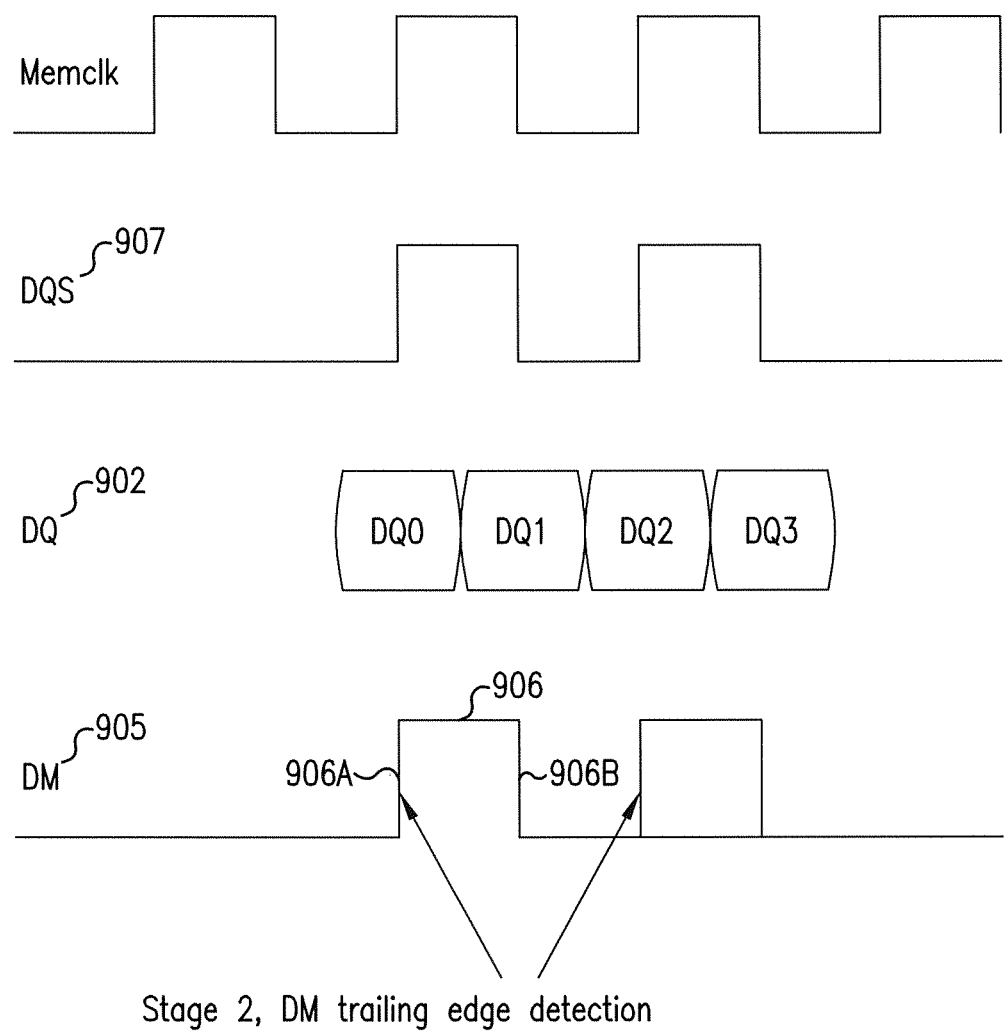

Once the leading edge 906B of the range of available DM delay values has been detected, the DM delay value is iteratively incremented with sequential writes, reads, and comparisons until the trailing edge is detected, as seen in FIG. 9D. The DM delay value is continuously swept in sequential steps until the comparison of the bits of the DQ signal 902 are no longer as expected according to the known data pattern and the known data masking resulting from the alternating 1-0 pattern applied by the DM signal 905. This determines the trailing edge 906A, and the range of suitable delay values for the DM signal is now established relative to the DQS signal 907.

Within the range of suitable delay values for the DM delay relative to the DQS signal, one or several optimal delay values may be chosen. Ideally, the optimal delay value is selected from a midpoint between the delay values yielding trailing and leading edge (906A and 906B) alignment between the DM signal and DQS signal, determined for instance by averaging the trailing and leading edge alignment delay values. As noted previously, it may be equally valid to sweep through the range of available DM delay values in the opposite direction, thus locating the trailing edge 906A first and the leading edge 906B second.

For convenience of description, the disclosures above have been largely in the specific context of random access memory (RAM), and in places, more specifically of dynamic random access memory (DRAM). However, those of skill in the art will recognize that the same principles may be applied, with minimal alteration, to other forms of memory, both volatile and non-volatile, and additionally to any data transfer where it is desirable to sync the data signal and a data mask applied to said signal with the destination of the transfer.

In various configurations of the invention, the system may be implemented in the form of software modules, hardware modules, or some mixture thereof. In an exemplary configuration of the invention, the system is implemented as part of a fabricated electronic device, as part of an Electronic Design Automation (EDA) software suite, or may be implemented in any suitable circuit design tool.

Figure 3:
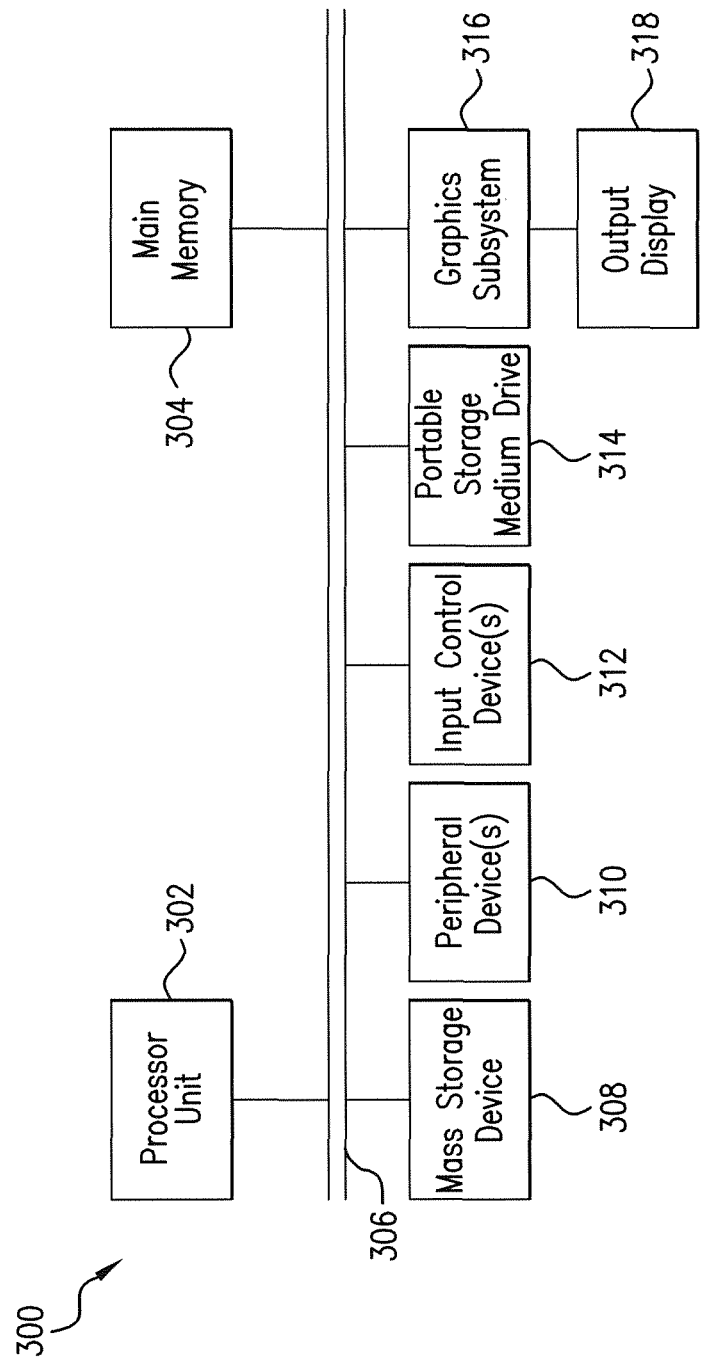
FIG. 3 is a schematic block diagram of an exemplary computer system for programmatic and/or hardware implementation of certain aspects of the disclosed system and method.

FIG. 3 illustrates a block diagram of a computer system which may serve as a host for such hardware modules and/or as a host for executing software modules such as EDA tools/simulations/emulation/firmware in accordance with various configurations of the present invention. A computer system 300 contains a processor unit 302, a main memory 304, an interconnect bus 306, a mass storage device 308, peripheral device(s) 310, input control device(s) 312, portable storage medium drive(s) 314, a graphics subsystem 316, and an output display 318. Processor unit 302 may include a single microprocessor or a plurality of microprocessors for configuring computer system 300 as a multi-processor system. Main memory 304 stores, in part, instructions and data to be executed by processor unit 302. Main memory 304 preferably includes banks of dynamic random access memory (DRAM) or synchronous dynamic random access memory (SDRAM) as well as high-speed cache memory.

For the purpose of simplicity, all the components of computer system 300 are connected via interconnect bus 306. However, computer system 300 may be connected through one or more data transport means. For example, processor unit 302 and main memory 304 may be connected via a local microprocessor bus; and mass storage device 308, peripheral device(s) 310, portable storage medium drive(s) 314, and graphics subsystem 316 may be connected via one or more input/output (I/O) buses. Mass storage device 308 may be implemented as a non-volatile memory for storing data and instructions to be used by processor unit 302. In a software configuration, mass storage device 308 may store the software to load it to the main memory 304 or may be represented in an EDA tool simulation by suitable classes (incorporating data structures and functions operable upon the data structures) or the like as would be known to one of skill in the art.

Portable storage medium drive 314 operates to input and output data and code to and from the computer system 300. In one configuration, the software is stored on such a portable medium, and is input to computer system 300 via portable storage medium drive 314. Peripheral device(s) 310 may include any type of computer support device such as an input/output (I/O) interface, to add additional functionality to computer system 300. For example, peripheral device(s) 310 may include a network interface card, to interface computer system 300 to a network. Peripheral device(s) may also include a memory controller and nonvolatile memory.

Input control device(s) 312 provide a portion of the user interface for a computer system 300 user. Input control device(s) 312 may include an alphanumeric keypad for inputting alphanumeric and other key information; and a cursor control device such as a mouse, a trackpad or stylus; or cursor direction keys.

In order to display textual and graphical information, computer system 300 contains graphics subsystem 314 and output display(s) 318. Output display 318 may include a cathode ray tube (CRT) display, liquid crystal display (LCD), plasma, or active matrix organic light emitting diode (AMOLED) display. Graphics subsystem 316 receives textual and graphical information, and processes the information for output to display 318.

In a software implementation, the software includes a plurality of computer executable instructions, to be implemented on a computer system. Prior to loading in a computer system, the software may reside as encoded information on a computer-readable tangible medium such as a magnetic floppy disk, a magnetic tape, CD-ROM, DVD-ROM, memory controller firmware, or any other suitable computer readable medium.

In a hardware implementation, the invention may comprise a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Thereby, a memory controller and memory may expeditiously train a relative timing delay between data strobe, data mask, and data signals to effect high speed reliable transfer therebetween.

The descriptions above are intended to illustrate possible implementations of the present invention and are not restrictive. While this disclosure has been made in connection with specific forms and embodiments thereof, it will be appreciated that various modifications other than those discussed above may be resorted to without departing from the spirit or scope of the claimed invention. Such variations, modifications, and alternatives will become apparent to the skilled artisan upon a review of the disclosure. For example, functionally equivalent elements or method steps may be substituted for the specifically shown and described, and certain features may be used independently of other features, and in certain cases, particular locations of elements or sequence of method steps may be reversed or interposed, all without departing from the spirit or scope of the invention as defined in the appended Claims. The scope of the Claims of the invention should therefore be determined with reference to the description above and the appended Claims, along with their full range of equivalents.

What is claimed is:

1. A method for data mask (DM) signal and data (DQ) signal timing alignment adjustment in transmission to a memory device, the method comprising:

performing write training of at least one DQ signal line using at least one known data pattern while maintaining a value of said DM signal at a constant value representing an unmasked condition to establish an optimal DQ delay value relative to a data strobe (DQS) signal; and, establishing an optimal DM delay value relative to said DQS signal for said DM signal by successively writing at least one known DQ signal data pattern using said optimal DQ delay value for transmission of DQ signals to said memory device while alternating said value of said DM signal to define a consistent sequence of alternating high and low values, to thereby provide a sequence of masked and unmasked bytes of said DQ signals during each write to said memory device, a DM signal delay value incrementally varied once for each of a plurality of consecutive writes to said memory device, said optimal DM delay value being established responsive to comparisons between said DQ signal data pattern and at least one retrieved data pattern from said memory device in correspondence with data masking in accordance with said alternating DM signal value sequence.

2. The method as recited in claim 1, where said DM signal is maintained at a zero value during said write training.

3. The method as recited in claim 1, where performing write training includes successively writing said known DQ signal data pattern while incrementally changing a delay value of said DQ signals relative to DQS signal.

4. The method as recited in claim 3, where said optimal DQ delay value is established as a mean of DQ delay values yielding alignment of leading and trailing edges of said DM signal relative to said DQS signal.

5. The method as recited in claim 1, where said optimal DQ delay value is established responsive to a comparison of said known DQ signal data pattern to a retrieved data pattern from said memory device subsequent to the writing thereto at a plurality of different delay values of said DQ signal relative to said DQS signal.

6. The method as recited in claim 1, where establishing an optimal DM delay value relative to said DQS signal includes:
   determining a first delay value corresponding to a first edge alignment between said DM signal and said DQS signal when an incremental change in delay value results in valid data being retrieved from said memory device for a first time;
   determining a second delay value corresponding to a second edge alignment between said DM signal and said DQS signal when an incremental change in delay value results in invalid data being retrieved from said memory device for a first time following retrieval of valid data; and
   selecting a delay value intermediate the first and second delay values.

7. The method as recited in claim 6, where said selected intermediate delay value is a mean value between said first and second delay values.

8. A method for data mask (DM) signal and data (DQ) signal timing alignment adjustment in transmission to a memory device, the method comprising:
   performing a first write training procedure of at least one DQ signal line using at least one known data pattern while maintaining a value of said DM signal at a constant value representing an unmasked condition to establish an optimal delay value of one of a data strobe (DQS) signal and DQ signals; and,
   performing a second write training procedure to establish an optimal DM delay value relative to said DQS signal for said DM signal by successively writing at least one known DQ signal data pattern using said optimal delay value of said one of a DQS signal and DQ signals established in said first write training procedure for transmission of DQ signals to said memory device while alternating said value of said DM signal to define a consistent sequence of alternating high and low values, to thereby provide a sequence of masked and unmasked bytes of said DQ signals during each write to said memory device, a DM signal delay value incrementally varied once for each of a plurality of consecutive writes to said memory device, said optimal DM delay value being established responsive to comparisons between said DQ signal data pattern and at least one retrieved data pattern from said memory device in correspondence with data masking in accordance with said alternating DM signal value sequence.

9. The method as recited in claim 8, where said optimal delay value of one of a DQS signal and DQ signals is an optimal DQ delay value.

10. The method as recited in claim 9, where performing said first write training procedure includes successively writing said known data pattern while incrementally changing a delay value of said DQ signals relative to DQS signal.

11. The method as recited in claim 10, where said optimal DQ delay value is established as a mean of DQ delay values yielding alignment of leading and trailing edges of said DM signal relative to said DQS signal.

12. The method as recited in claim 9, where said optimal DQ delay value is established responsive to a comparison of said known data pattern to a retrieved data pattern from said memory device subsequent to the writing thereto at a plurality of different delay values of said DQ signal relative to said DQS signal.

13. The method as recited in claim 8, where said DM signal is maintained at a zero value during said first write training procedure.

14. The method as recited in claim 8, where establishing an optimal DM delay value relative to said DQS signal includes:
   determining a first delay value corresponding to a first edge alignment between said DM signal and said DQS signal when an incremental change in delay value results in valid data being retrieved from said memory device for a first time;
   determining a second delay value corresponding to a second edge alignment between said DM signal and said DQS signal when an incremental change in delay value results in invalid data being retrieved from said memory device for a first time following retrieval of valid data; and
   selecting a delay value intermediate the first and second delay values.

15. The method as recited in claim 14, where said selected intermediate delay value is a mean value between said first and second delay values.

16. A system for calibrating a data mask (DM) signal used to mask a selected portion of data transmitted to a memory device, comprising a memory controller including:
   a control circuit for performing DM signal training in conjunction with the memory device;
   a timing generator establishing a data strobe (DQS) signal;
   a first delay circuit coupled to said control circuit and operable to selectively delay data (DQ) signals being transmitted to the memory device at any of a plurality of delay values in a range of available selectable delay values responsive a delay value signal from said control circuit; and
   a second delay circuit coupled to said control circuit and operable to selectively delay a DM signal being transmitted to the memory device at any of a plurality of delay values in a range of available selectable delay values responsive a delay value signal from said control circuit;
   wherein said control circuit is configured to perform a first write training procedure of at least one DQ signal line using at least one known data pattern while maintaining a value of said DM signal at a constant value representing an unmasked condition to establish an optimal delay value of one of said DQS signal and DQ signals, and then perform a second write training procedure to establish an optimal DM delay value relative to said DQS signal for said DM signal by successively writing at least one known DQ signal data pattern using said optimal delay value of said one of a DQS signal and DQ signals established in said first write training procedure for transmission of DQ signals to said memory device while alternating said value of said DM signal to define a consistent sequence of alternating high and low values, to thereby provide a sequence of masked and unmasked bytes of said DQ signals during each write to said memory device, a DM signal delay value incrementally varied once for each of a plurality of consecutive writes to said memory device, said control circuit performing comparisons between said DQ signal data pattern and at least one retrieved data pattern from said memory device in correspondence with data masking in accordance with said alternating DM signal value sequence to establish said optimal DM delay value.

17. The system as recited in claim 16, where said control circuit successively writes said known data pattern while incrementally changing a delay value of said DQ signals relative to said DQS signal while performing said first write training procedure.

18. The system as recited in claim 16, where said control circuit compares said known data pattern to a retrieved data pattern from said memory device subsequent to the writing thereto at a plurality of different delay values of one of said DQS signal and DQ signals relative to the other of said DQ signal and DQS signal to establish said optimal delay value of one of said DQS signal and DQ signals.

19. The system as recited in claim 16, where said control circuit in performing said second write training procedure determines (a) a first delay value corresponding to a first edge alignment between said DM signal and said DQS signal when an incremental change in delay value results in valid data being retrieved from said memory device for a first time, and (b) a second delay value corresponding to a second edge alignment between said DM signal and said DQS signal when an incremental change in delay value results in invalid data being retrieved from said memory device for a first time following retrieval of valid data, said control circuit subsequently selects a delay value intermediate the first and second delay values to establish said optimal DM delay value relative to said DQS signal.

20. The system as recited in claim 16, where said control circuit successively writes said known data pattern while incrementally changing a delay value of said DQS signal relative to said DQ signals while performing said first write training procedure.

\* \* \* \* \*